United States Patent
Kim et al.

(10) Patent No.: US 8,471,242 B2
(45) Date of Patent: Jun. 25, 2013

(54) LIGHT EMITTING DEVICE, LIGHT EMITTING DEVICE PACKAGE AND LIGHTING SYSTEM

(75) Inventors: SungKyoon Kim, Seoul (KR); MinGyu Na, Seoul (KR); HyunSeoung Ju, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 22 days.

(21) Appl. No.: 13/313,489

(22) Filed: Dec. 7, 2011

(65) Prior Publication Data

US 2012/0153255 A1   Jun. 21, 2012

(30) Foreign Application Priority Data

Dec. 20, 2010   (KR) .................. 10-2010-0130767

(51) Int. Cl.
*H01L 29/06* (2006.01)

(52) U.S. Cl.
USPC .................. 257/13; 257/79; 257/81; 257/86; 257/93; 257/99

(58) Field of Classification Search
None
See application file for complete search history.

(56) References Cited

U.S. PATENT DOCUMENTS

2006/0192206 A1*   8/2006   Kong et al. .................... 257/79

\* cited by examiner

*Primary Examiner* — Kyoung Lee
(74) *Attorney, Agent, or Firm* — KED & Associates LLP

(57) ABSTRACT

Disclosed is a light emitting device, including: a substrate, a light emitting structure provided on the substrate, which includes a first conductive semiconductor layer, an active layer and a second conductive semiconductor layer laminated in sequential order, a transmissive electrode layer arranged on the light emitting structure, an electrode provided on the light emitting structure. Here, the electrode includes a pad electrode and a finger electrode, and an insertion element is placed between the finger electrode and the second conductive semiconductor layer, wherein the insertion element is formed such that at least one region thereof overlaps with the finger electrode in a vertical direction. Since the insertion element is formed under the finger electrode, it is possible to prevent light emitted by the active layer from being absorbed by the finger electrode. Accordingly, luminous efficacy of the light emitting device may be further enhanced.

20 Claims, 17 Drawing Sheets

LIGHT EMITTING DEVICE, LIGHT EMITTING DEVICE PACKAGE AND LIGHTING SYSTEM

CROSS-REFERENCE TO RELATED APPLICATION

This application claims the benefit of Korean Application No. 10-2010-0130767, filed on, Dec. 20, 2010 in the Korean Intellectual Property Office, the disclosure of which is incorporated herein by reference.

BACKGROUND

1. Field

Embodiments relate to a light emitting device, a light-emitting device package and a lighting system.

2. Description of the Related Art

A light emitting diode (LED) is a device to convert electrical energy into infrared light, visible light or other wavelengths of light using characteristics of a compound semiconductor, and is generally used for home electronic appliances, remote controllers, electric sign boards, indicators, other automated instruments, or the like, and increasingly being used for a wide range of applications.

A small LED is generally fabricated in a surface mount device (SMD) type in order to be directly mounted on a printed circuit board (PCB) and, accordingly, a LED lamp used as a display device is also developed in such an SMD form. The SMD may replace a simple lighting lamp and be used for a lighting indicator, a text display, an image display, etc., which emit different colors.

With increasing application of LEDs, an electric lamp used in daily life, a distress signal lamp, or the like may require higher brightness. Therefore, it is important to increase LED luminance.

SUMMARY

The present embodiment provides a light emitting device with improved luminous efficacy, having a insertion element provided on the bottom of an electrode, and a light-emitting device package including the same.

According to one embodiment, there is provided a light emitting device, including: a substrate; a light emitting structure including a first conductive semiconductor layer, a second conductive semiconductor layer and an active layer formed between the first and second semiconductor layers; a transmissive electrode layer placed on the light emitting structure; an electrode including a pad electrode and a finger electrode that is connected to the pad electrode and extends in at least one direction, provided on the light emitting structure; and a insertion element located between the finger electrode and the second conductive semiconductor layer, wherein at least a part of the insertion element overlaps the second electrode in a vertical direction.

The insertion element is configured to change a route of light emitted by the active layer.

The insertion element is configured to reflect light emitted by the active layer.

The insertion element is configured to refract light emitted by the active layer.

The insertion element may contain at least one selected from Ag, Ni, Al, Rh, Pd, Ir, Ru, Mg, Zn, Pt, Au, Hf, Cu, IZO, IZTO, IAZO, IGZO, IGTO, AZO, ATO, IZO/Ni, AZO/Ag, IZO/Ag/Ni and AZO/Ag/Ni.

The transmissive electrode layer may contain at least one selected from ITO, IZO(In—ZnO), GZO(Ga—ZnO), AZO (Al—ZnO), AGZO(Al—Ga ZnO), IGZO(In—Ga ZnO), $IrO_x$, $RuO_x$, $RuO_x$/ITO, Ni/$IrO_x$/Au and Ni/$IrO_x$/Au/ITO.

The insertion element may contact the second conductive semiconductor layer.

The insertion element may be spaced apart from the second conductive semiconductor layer.

At least a part of the insertion element may have curvature.

A width of the insertion element may range from 2 μm to 2.5 mm.

A thickness of the insertion element may range from 2000 Å to 5 μm.

The insertion element may also include an extension part and the extension part may be formed in such a way that at least one part of the extension part overlaps with the pad electrode layer in a vertical direction.

An area of the extension part may be larger than an area of the pad electrode.

A transmissive insulation layer may be further provided between the finger electrode and the insertion element.

The transmissive insulation layer may include $SiO_2$ or $Al_2O_3$.

The insertion element may be formed in such a way that at least a part of the insertion element contacts the transmissive insulation layer.

The insertion element may include unevenness and the unevenness may be formed in a region at which it contacts the transmissive insulation layer.

The insertion element may contain a material having a reflectivity of 30% or more.

The insertion element may have a region extending in a lateral direction of the electrode.

The insertion element may include a first layer and a second layer having different reflectivity.

BRIEF DESCRIPTION OF THE DRAWINGS

The above and other features and other advantages of the present embodiment will be more clearly understood from the following detailed description taken in conjunction with the accompanying drawings, in which.

DETAILED DESCRIPTION OF THE PREFERRED EMBODIMENTS

Figure 1:
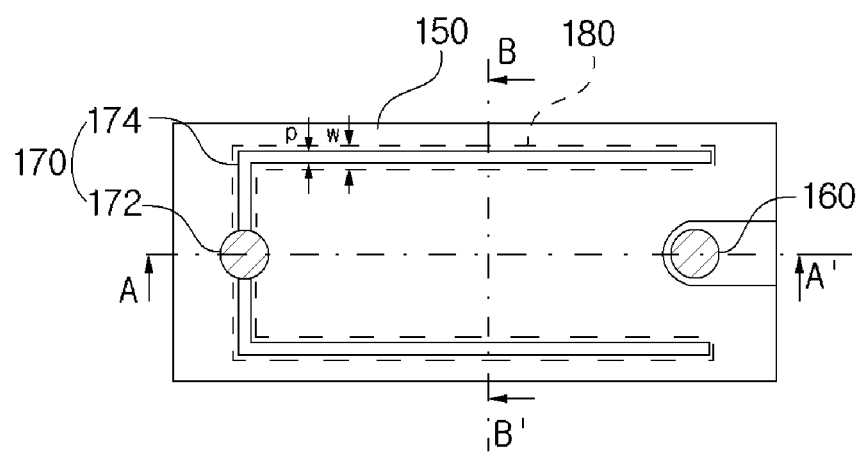
FIG. 1 is a top perspective view showing a light emitting device according to one embodiment.

Reference will now be made in detail to the preferred embodiments of the present disclosure, examples of which are illustrated in the accompanying drawings.

Advantages and characteristics of the present embodiment and methods for addressing the same will be clearly understood from the following embodiments taken in conjunction with the annexed drawings. However, the present disclosure is not limited to the embodiments and may be realized in various other forms. The embodiments are only provided to more completely illustrate the present disclosure and to render a person having ordinary skill in the art to fully understand the scope of the present disclosure. The scope of the present disclosure is defined only by the claims. Accordingly, in some embodiments, well-known processes, well-known device structures and well-known techniques are not illustrated in detail to avoid unclear interpretation of the present disclosure. The same reference numbers will be used throughout the specification to refer to the same or like parts.

Spatially relative terms, "below", "beneath", "lower", "above", "upper" and the like may be used to indicate the relationship between one device or constituent elements and other devices or constituent elements, as shown in the drawings. It should be understood that the spatially relative terms include the direction illustrated in the drawings as well as other directions of devices during use or operation. For example, in a case in which the device shown in the drawing is reversed, a device arranged "below" or "beneath" the other device may be arranged "above" the other device. Accordingly, the exemplary term, "beneath" may include "below" or "beneath" and "above". The device may be arranged in other directions. As a result, the spatially relative terms may be construed depending on orientation.

Terms used in the specification are only provided to illustrate the embodiments and should not be construed as limiting the scope and spirit of the present disclosure. In the specification, a singular form of terms includes plural forms thereof, unless specifically mentioned otherwise. In the term "comprises" and/or "comprising" as used herein, the mentioned component, step, operation and/or device is not excluded from presence or addition of one or more other components, steps, operations and/or devices.

Unless defined otherwise, all terms (including technical and scientific terms) used herein may have meanings understood by those skilled in the art. In addition, terms defined in general dictionaries should not be interpreted abnormally or exaggeratedly, unless clearly specifically defined.

In the drawings, the thicknesses or sizes of respective layers are exaggerated, omitted or schematically illustrated for clarity and convenience of description. Therefore, the sizes of respective elements do not wholly reflect actual sizes thereof.

In addition, angles and directions referred to during description of a structure of a light emitting device are described based on illustration in the drawings. In the description of the structure of the light emitting device, if reference points with respect to the angles and positional relations are not clearly stated, the related drawing will be referred to.

Figure 2:
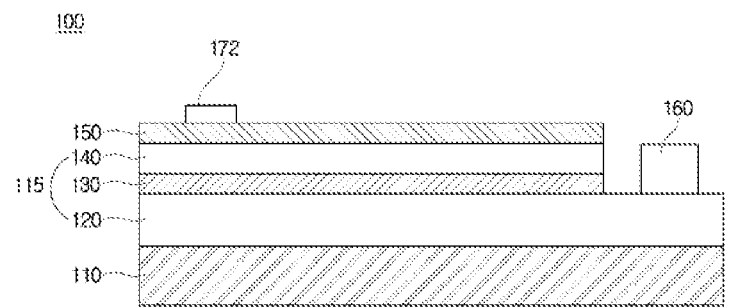
FIG. 2 is a cross-sectional view taken along line A-A' of the light emitting device shown in FIG. 1.
Figure 7:
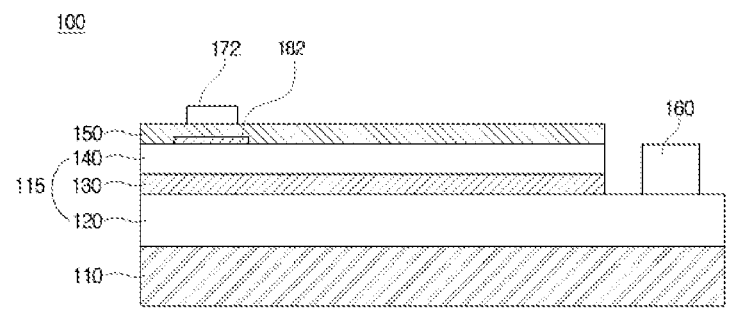
FIG. 7 is a cross-sectional view taken along line A-A' of the light emitting device shown in FIG. 1.
Figure 8:
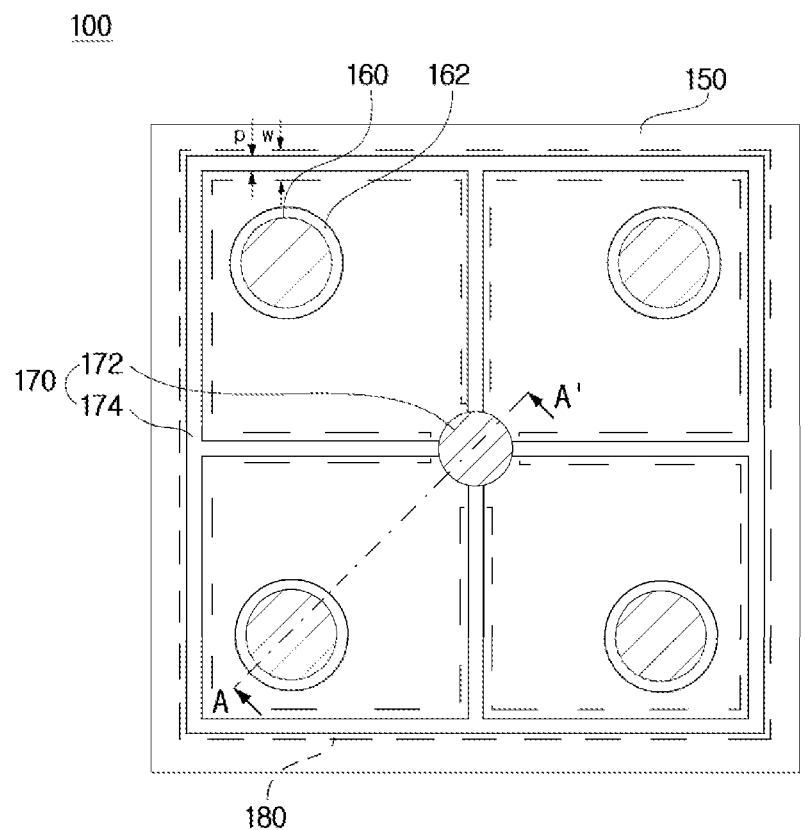
FIG. 8 is a plan view showing a light emitting device according to one embodiment.
Figure 9:
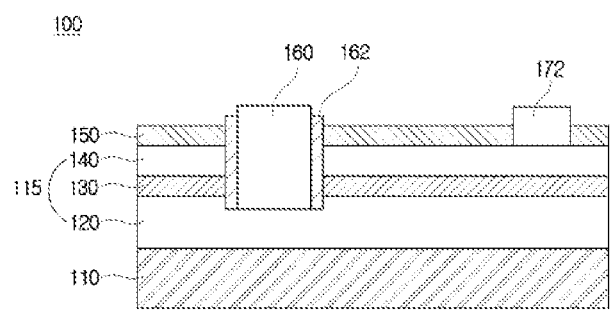
FIG. 9 is a cross-sectional view taken along line A-A' of the light emitting device shown in FIG. 8.
Figure 10:
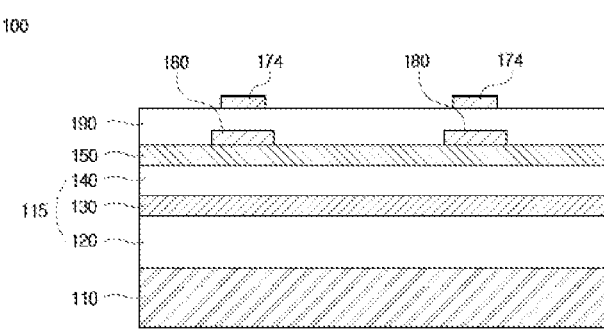
FIG. 10 is a cross-sectional view showing a light emitting device according to one embodiment.
Figure 11:
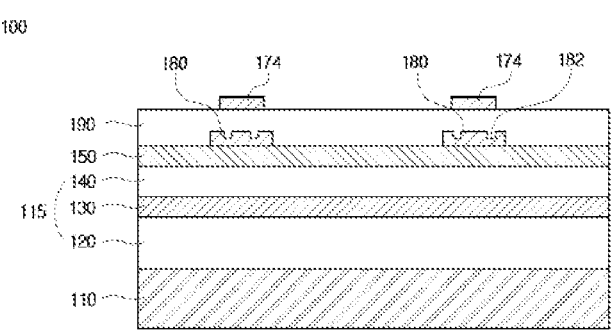
FIG. 11 is a cross-sectional view showing a light emitting device according to one embodiment.
Figure 12:
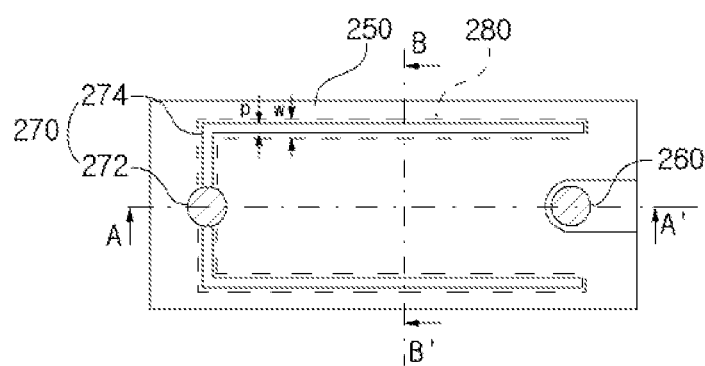
FIG. 12 is a plan view showing a light emitting device according to one embodiment.
Figure 13:
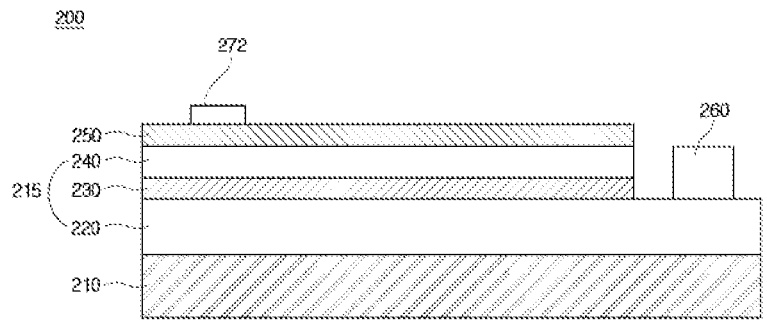
FIG. 13 is a cross-sectional view taken along line A-A' of the light emitting device shown in FIG. 12.
Figure 14:
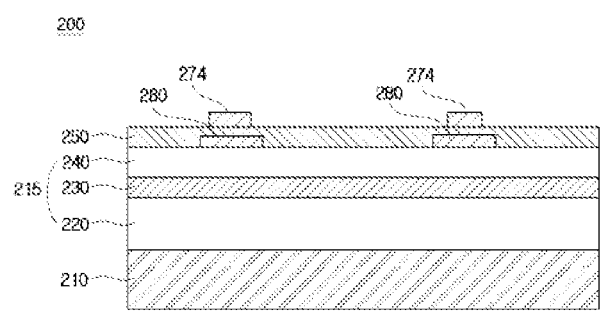
FIG. 14 is a cross-sectional view taken along line B-B' of the light emitting device shown in FIG. 12.

FIG. 1 is a plan perspective view showing a light emitting device according to one embodiment; FIGS. 2 and 7 are cross-sectional views taken along lines A-A' of the light emitting device shown in FIG. 1; and FIGS. 3 to 6 are cross-sectional views taken along lines B-B' of the light emitting device shown in FIG. 1. In addition, FIG. 8 is a plan view showing a light emitting device according to one embodiment, FIG. 9 is a cross-sectional view taken along lines A-A' of the light emitting device shown in FIG. 8, and FIGS. 10 and 11 are cross-sectional views showing a light emitting device according to one embodiment.

Referring to FIGS. 1 to 11, a light emitting device 100 according to the present disclosure comprises: a substrate 110; a light emitting structure 115 including a first conductive semiconductor layer 120, a second conductive semiconductor layer 140 and an active layer 130 provided between the first conductive semiconductor layer 120 and the second conductive semiconductor layer 140; a transmissive electrode layer 150 arranged on the light emitting structure 115; an electrode 170 including a pad electrode 172 and a finger electrode 174 which is connected to the pad electrode 172 and extends in one direction; and a reflective layer 180 provided between the finger electrode 174 and the second conductive semiconductor layer 140, wherein the reflective layer 180 is formed in such a way that at least a part thereof overlaps with the finger electrode 174 in a vertical direction.

The substrate 110 may be formed using a material with high thermal conductivity and/or a conductive material, for example, a metal or conductive ceramic material. The substrate 110 may take the form of a single layer, double structure or multilayer structure.

That is, the substrate 110 may be prepared using metals, for example, at least one selected from Au, Ni, W, Mo, Cu, Al, Ta, Ag, Pt and Cr or alloys comprising a combination of two or more thereof and, in addition, by laminating two or more of different materials. The substrate 110 may also be formed of a carrier wafer. For instance, this may be realized using Si, Ge, GaAs, ZnO, SiC, SiGe, GaN, $Ga_2O_3$, etc.

The substrate 110 described above may easily discharge heat generated in the light emitting device 100, thus improving thermal stability of the light emitting device 100.

Although not illustrated, the substrate 110 may further include an anti-reflective layer (not shown) to improve light extraction efficiency. The anti-reflective layer (not shown) is called an anti-reflective coating ('AR coat') layer and principally utilizes interference phenomenon between reflected light from multiple interfaces. That is, the intensity of the reflected light may be attenuated by slanting the phases of light reflected from different interfaces to an angle of 180° to one another, thus enabling offset thereof, without being limited thereto.

Further, although not illustrated, the substrate 110 may further include a buffer layer (not shown) to alleviate lattice mismatch between the substrate 110 and the first conductive semiconductor layer 120, and to render the semiconductor layers to be easily grown.

The buffer layer (not shown) may be formed using a material having a lattice constant between the substrate 110 and the light emitting structure 115. For example, AlN, GaN, InN, AlInN, InGaN, AlGaN, InAlGaN, ZnO, or the like may be used, and the buffer layer may be formed in a multi-layer structure such as an AlInN/GaN laminate structure, an InGaN/GaN laminate structure, an AlInGaN/InGaN/GaN laminate structure, etc.

Above the substrate 110, the light emitting structure 115 including the first conductive semiconductor layer 120, the active layer 130 and the second conductive semiconductor layer 140 may be provided.

The first conductive semiconductor layer 120 may be placed on the substrate 110. The first semiconductor layer 120 may be realized as an n-type semiconductor layer, wherein the n-type semiconductor layer may be selected from semiconductor materials having the formula represented by $In_xAl_yGa_{1-x-y}N$ ($0 \leq x \leq 1$, $0 \leq y \leq 1$, $0 \leq x+y \leq 1$), for example, a group consisting of GaN, AlN, ALGaN, InGaN, InN, InAlGaN, AlInN, etc., and n-type dopants such as Si, Ge, Sn, Se or Te may be doped thereon.

The active layer 130 may be provided on the first conductive semiconductor layer 120. The active layer 130 may be formed with a double-hetero structure (DH), a single or multi-quantum well structure, a quantum-wire structure, a quantum dot structure, or the like, using compound semiconductor materials based on Group III-V elements.

In the case where the active layer 130 has a quantum well structure, for example, it may have a single or multi-quantum well structure including a well layer having the formula of $In_xAl_yGa_{1-x-y}N$ ($0 \leq x \leq 1$, $0x \leq y1$, $0 \leq x+y \leq 1$) and a barrier layer having a formula of $In_aAl_bGa_{1-a-b}N$ ($0 \leq a \leq 1$, $0 \leq b \leq 1$, $0 \leq a+b \leq 1$). The well layer may be formed of a material having a smaller band gap than the barrier layer.

Above and/or below the active layer 130, a conductive clad layer (not shown) may be provided. The conductive clad layer (not shown) may have a larger band gap than that of the active layer 130 and, for example, be formed of an AlGaN-based semiconductor.

The second conductive semiconductor layer 140 may be provided on the active layer 130. The second conductive semiconductor layer 140 may be realized as a p-type semiconductor layer doped with a p-type dopant, wherein the p-type semiconductor layer may be selected from semiconductor materials having the formula of $In_xAl_yGa_{1-x-y}N$ ($0 \leq x \leq 1$, $0 \leq y \leq 1$, $0 \leq x+y \leq 1$) such as GaN, AlN, ALGaN, InGaN, InN, InAlGaN and AlInN and may be doped with a p-type dopant such as Mg, Zn, Ca, Sr or Ba.

The first semiconductor layer 120, active layer 130 and second semiconductor layer 140 may be fabricated by conventional methods, for example, metal organic chemical vapor deposition (MOCVD), chemical vapor deposition (CVD), plasma-enhanced chemical vapor deposition (PECVD), molecular beam epitaxy (MBE), hydride vapor phase epitaxy (HYPE), and so forth, however, the method is not particularly limited thereto.

A doping concentration of the conductive dopant in the first semiconductor layer 120 and the second semiconductor layer 140 may be uniform or non-uniform. That is, the structure of a plurality of semiconductor layers may be varied, without being particularly limited thereto.

Meanwhile, the light emitting structure 115 may further include a third conductive semiconductor layer (not shown) having polarity opposite to the first conductive semiconductor layer 120, which is arranged under the first conductive semiconductor layer 120. The first conductive layer 120 may be a p-type semiconductor layer while the second conductive semiconductor layer 140 may be realized as an n-type semiconductor layer. Accordingly, the light emitting structure layer 115 may include at least one selected from N-P junction, P-N junction, N-P-N junction and P-N-P junction structures.

The transmissive electrode layer 150 may be provided on the second conductive layer 140.

The transmissive electrode layer 150 may comprise at least one selected from ITO, IZO(In—ZnO), GZP(Ga—ZnO), AZO(Al—ZnO), AGZO(Al—Ga ZnO), IGZO(In—Ga ZnO), $IrO_x$, $RuO_x$, $RuO_x$/ITO, Ni/$IrO_x$/Au and Ni/$IrO_x$/Au/ITO, and being formed on the top of the second conductive semiconductor layer 140 to prevent current crowding.

Meanwhile, the active layer 130, the second conductive semiconductor layer 140 and the transmissive electrode layer 150 are partially removed to expose the first conductive semiconductor layer 120 and, on the exposed top of the first conductive semiconductor layer 120, a first electrode 160 may be formed.

In addition, a second electrode 170 may be formed on the top of the second conductive semiconductor layer 140. The second electrode 170 may be electrically connected to the second conductive semiconductor layer 140 by removing a part of the transmissive electrode layer 150 and exposing a part of the second conductive semiconductor layer 140 or, otherwise, through electrical connection to the transmissive electrode layer 150.

Partial exposure of the first or second conductive semiconductor layer 120 or 140 may be achieved by an appropriate etching process.

The first and second electrodes 160 and 170, respectively, may comprise a conductive material, for example, a metal selected from In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or alloys thereof. Each of the electrodes may be formed in a single layer or multi-layer structure.

Meanwhile, as shown in FIGS. 1 to 11, the first electrode 160 may be formed on the first conductive semiconductor layer 120, which was exposed by etching a lateral region of the light emitting device 100. Otherwise, as shown in FIGS. 8 and 9, after forming a through-hole that passes through the active layer 130, the second conductive semiconductor layer 140 and the transmissive electrode layer 150 on one region of the top face of the light emitting device 100, the first electrode 160 may be formed on the first conductive semiconductor layer 120 exposed through the through-hole, without being particularly limited thereto.

In order to form the through-hole that passes through the active layer 130, the second conductive semiconductor layer 140 and the transmissive electrode layer 150, partial etching using a mask pattern may be used, without being particularly limited thereto. In this case, in order to prevent electrical connection of the first electrode 160 with the active layer 130, the second conductive semiconductor layer 140 and the transmissive electrode layer 150, an insulating layer 162 may be provided to isolate (insulate) the first electrode 160 from the active layer 130, the second conductive semiconductor layer 140 and the transmissive electrode layer 150, without being particularly limited thereto.

The second electrode 170 may include at least one pad electrode 172 and a finger electrode 174 having a predetermined pattern.

As shown in FIG. 1, the pad electrode 172 may be arranged in a horizontal center part among the top face of the second conductive semiconductor layer 140 or, otherwise, an outer region or edge region thereof, without being particularly limited thereto.

The finger electrode 174 may be connected to the pad electrode 172 and may extend in any direction. The finger electrode 174 may have a bent part or curvature, without being limited thereto, as shown in FIG. 1.

A width of the finger electrode 174 may range from 2 to 50 μm, without being particularly limited thereto.

Although not illustrated in FIGS. 1 to 11, the first electrode 160 may also have a finger electrode (not shown) having any shape, size and arrangement, without being limited thereto.

Such a finger electrode 174 may enable easy current diffusion.

Although not illustrated in FIGS. 1 to 11, a current blocking layer (CBL) (not shown), wherein at least one region of the CBL overlaps with the pad electrode 172 and/or the finger electrode 174 in a vertical direction, may be formed on the second conductive semiconductor layer 140.

Such CBL (not shown) may be formed using non-conductive or weak-conductive materials. For example, the CBL may comprise at least one of ITO, IZO, IZTO, IAZO, IGTO, AZO, ATO, ZnO, $SiO_2$, $SiO_x$, $SiO_xN_y$, $Si_3N_4$, $Al_2O_3$, $TiO_x$, $TiO_2$, Ti, Al or Cr.

The CBL (not shown) may prevent current crowding wherein electrons are concentrated on the lower part of the finger electrode 174 and/or the pad electrode 172.

Although a width of the CBL (not shown) is not particularly limited, the width may be broader than the width of the pad electrode 172 and/or the finger electrode 174.

Under the finger electrode 174, a reflective layer 180 may be provided. More particularly, the reflective layer 180 is formed under the finger electrode 174 and at least one region thereof may overlap with the finger electrode 174 in a vertical direction, in order to cover the finger electrode 174 when viewed in an upper vertical direction.

The reflective layer 180 may include a material having excellent reflective properties, for example, at least one among Ag, Ni, Al, Rh, Pd, Ir, Ru, Mg, Zn, Pt, Au, Hf and Cu, or a combination thereof. Otherwise, using the foregoing metal together with a transmissive material such as IZO, IZTO, IAZO, IGZO, IGTO, AZO, ATO, etc., the reflective layer may be formed in a single or multi-layer structure. The reflective layer 180 may be laminated in the form of IZO/Ni, AZO/Ag, IZO/Ag/Ni, AZO/Ag/Ni, or the like. The reflective layer 180 may be formed by E-beam or sputtering, without being particularly limited thereto.

Figure 3:
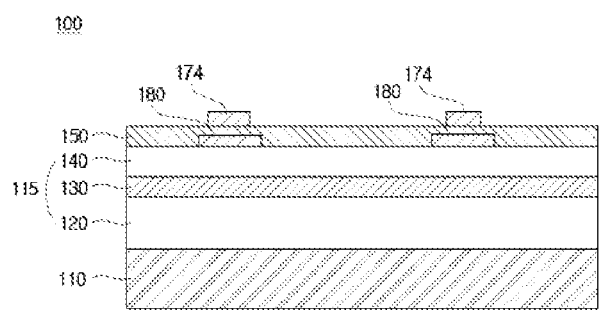
FIG. 3 is a cross-sectional view taken along line B-B' of the light emitting device shown in FIG. 1.

The reflective layer 180 may be present in the light emitting electrode layer 150 or, as shown in FIG. 3, formed to contact the second conductive semiconductor layer 140. Otherwise, as shown in FIG. 5, the reflective layer 180 may be inserted into the light emitting electrode layer 150 to form a layer or present on the top of the light emitting electrode layer 150, without being particularly limited thereto.

Figure 5:
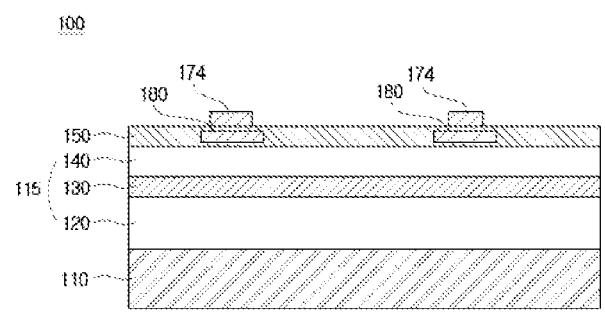
FIG. 5 is a cross-sectional view taken along line B-B' of the light emitting device shown in FIG. 1.
Figure 6:
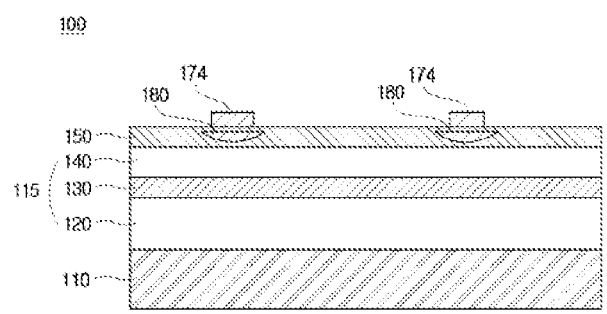
FIG. 6 is a cross-sectional view taken along line B-B' of the light emitting device shown in FIG. 1.

The reflective layer 180 may be in a thin layer form as shown in FIGS. 3 and 5, or may have a curvature area as shown in FIG. 6 or include unevenness (not shown), without being particularly limited thereto. When viewing the reflective layer 180 in a vertical direction, it may take a polygonal, circular or curved shape, without being particularly limited thereto. A width of the reflective layer 180 may be different in respective regions and, may have a larger width than the finger electrode 174, to cover the finger electrode 174.

If the reflective layer 180 has an excessively large width, light propagation in an upper direction may be excessively blocked. On the other hand, when the reflective layer 180 has a considerably smaller width, compared to the electrode 170, light absorbed in the electrode 170 may not be blocked. For instance, a width 'w' of the reflective layer 180 may be about 1 to 50 times a width 'p' of the finger electrode 174. More particularly, the width 'w' of the reflective layer 180 may range from 2 μm to 2.5 mm.

If the reflective layer 180 is excessively thin, it is difficult to form the reflective layer 180, in turn restricting functions thereof. On the other hand, when the reflective layer 180 is excessively thick, there is a difficulty in bonding and a size of the light emitting device 100 may be increased. Therefore, the reflective layer 180 may have a thickness of, for example, 2000 Å to 5 μm.

In the case where a current blocking layer (CBL) (not shown) is provided under the finger electrode 174, the reflective layer 180 may be arranged above or under the CBL (not shown), without being particularly limited thereto.

Figure 4:
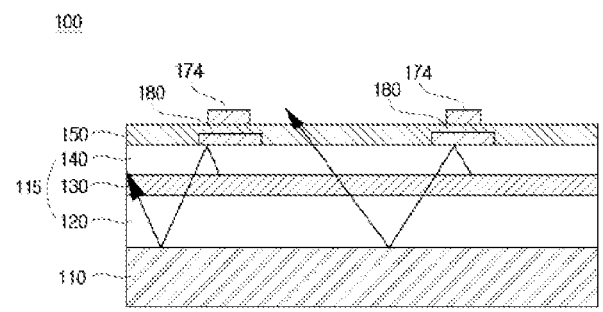
FIG. 4 is a cross-sectional view taken along line B-B' of the light emitting device shown in FIG. 1.

Since the reflective layer 180 is formed under the finger electrode 174, as shown in FIG. 4, it is possible to prevent light emitted by the active layer 130 from being absorbed by the finger electrode 174. Therefore, luminous efficacy of the light emitting device 100 may be further enhanced.

Referring to FIG. 7, the reflective layer 180 may include an extension part 182 wherein the extension part 182 may extend to be arranged under the pad electrode 172.

The extension part 182 may be formed under the pad electrode 172 to cover the pad electrode 172 in a vertical direction, and have a wider area than that of the pad electrode 172.

The reflective layer 180 may include the extension part 182 present under the pad electrode 172 and, when the CBL (not shown) is present under the pad electrode 172, the extension part 182 may be formed above or under the CBL (not shown), without being particularly limited thereto.

Referring to FIGS. 10 and 11, the light emitting device 100 may have a transmissive insulation layer 190 provided between the reflective layer 180 and the finger electrode 174.

The transmissive insulation layer 190 may comprise materials having insulation and transmissive properties and, for example, silicon dioxide ($SiO_2$) or aluminum oxide ($Al_2O_3$) containing $SiO_2$.

As shown in FIG. 10, the transmissive insulation layer 190 may be placed between the reflective layer 180 and the finger electrode 174, or formed by inserting the reflective layer 180 into the transmissive insulation layer 190 to form a layer, without being particularly limited thereto.

Between the reflective layer 180 and the finger electrode 174, the transmissive insulation layer 190 is provided to prevent the reflective layer 180 as well as the finger electrode 174 from being detached and stripped therefrom. Further, binding of the finger electrode 174 to the reflective layer 180 may be reliably achieved.

Meanwhile, as shown in FIG. 11, the reflective layer 180 may have an unevenness 182 formed in a region at which the reflective layer 180 contacts the transmissive insulation layer 190. Since the unevenness 182 is present in the region at which the reflective layer 180 and the transmissive insulation layer 190 contact to each other, a contact area between the reflective layer 180 and the light emitting insulation layer 190 may be increased and, therefore, the reflective layer 180 and the finger electrode 174 may be reliably protected from detachment and stripping off thereof. Moreover, the reflective layer 180 and the transmissive insulation layer 190 may be reliably bound therebetween.

FIGS. 12 to 18 are cross-sectional views showing a light emitting device according to one embodiment.

Referring to FIGS. 12 to 18, the light emitting device 200 according to the forgoing embodiment may include; a substrate 210; a light emitting structure 215 that includes a first conductive semiconductor layer 220, a second conductive semiconductor layer 240 and an active layer 230 provided between the first conductive semiconductor layer 220 and the second conductive semiconductor layer 240; a transmissive electrode layer 250 arranged on the light emitting structure 215; and an insertion layer 280 to change a route of light emitted by the active layer 230 in the transmissive electrode layer 250; and a second electrode 270 having a region partially overlapping with the insertion layer 280 in a vertical direction.

In this regard, the substrate 210, the light emitting structure 215, the first conductive semiconductor layer 220, the active layer 230, the second conductive semiconductor layer 240, the transmissive electrode layer 250, the first electrode 260 and the second electrode 270 are substantially identical to those described above and, therefore, a detailed description thereof will be omitted for brevity.

The insertion layer 280 may change the route of light emitted by the active layer 230. For instance, the insertion layer 280 may comprise a reflective layer having a light reflectivity, as described above, or may be a refractive layer to refract incident light at a predetermined angle.

Figure 15:
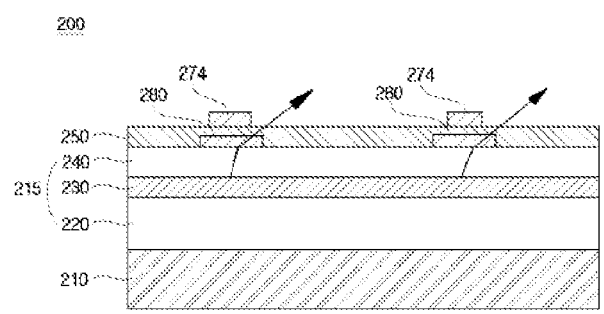
FIG. 15 is a cross-sectional view taken along line B-B' of the light emitting device shown in FIG. 12.

If the insertion layer 280 comprises the refractive layer, the insertion layer 280 may bend (refract) the incident light to have a predetermined refractive angle, as illustrated in FIG. 15.

Figure 16:
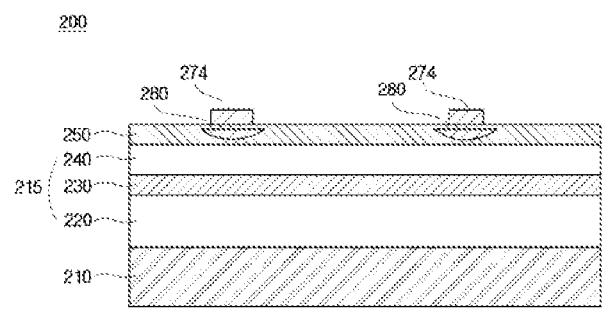
FIG. 16 is a cross-sectional view taken along line B-B' of the light emitting device shown in FIG. 12.

For instance, the insertion layer 280 may be formed to have a predetermined refractive angle. Otherwise, the insertion layer 280 may be formed to have any desired shape or have a curved face at one side, for example, such as a lens, as illustrated in FIG. 16.

Since the insertion layer 280 changing a route of light is provided between the light emitting structure 215 and the electrode 270, it is possible to prevent light emitted by the active layer 230 from being absorbed by the electrode 270, thereby improving luminous efficacy of the light emitting device 200.

The insertion layer 280 may comprise a material having light transmission and light reflection properties. For instance, the insertion layer 280 may function as a beam splitter that partially transmits incident light while partially reflecting the same, in turn guiding the light in a predetermined direction. Here, the insertion layer may have a light reflectivity of 30% or more.

Further, the insertion layer 280 may extend over the electrode 270 in a lateral direction. By extending the insertion layer 280 over the electrode 270 to have a larger area than the electrode 270, absorption of light (emitted by the active layer 230) by the electrode 270 may be decreased.

Figure 17:
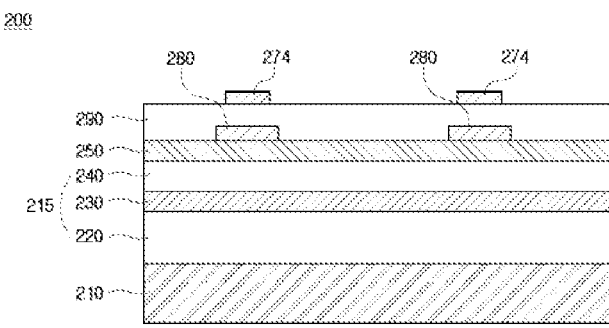
FIG. 17 is a cross-sectional view taken along line B-B' of the light emitting device shown in FIG. 12.

As illustrated in FIG. 17, a transmissive insulation layer 290 may be arranged on at least one region of the light emitting structure 215, and the insertion layer 280 may be formed such that at least one region contacts the transmissive insulation layer 290. The transmissive insulation layer 290 may include silicon dioxide ($SiO_2$) or aluminum oxide ($Al_2O_3$) containing silicon dioxide ($SiO_2$), without being particularly limited thereto.

Figure 18:
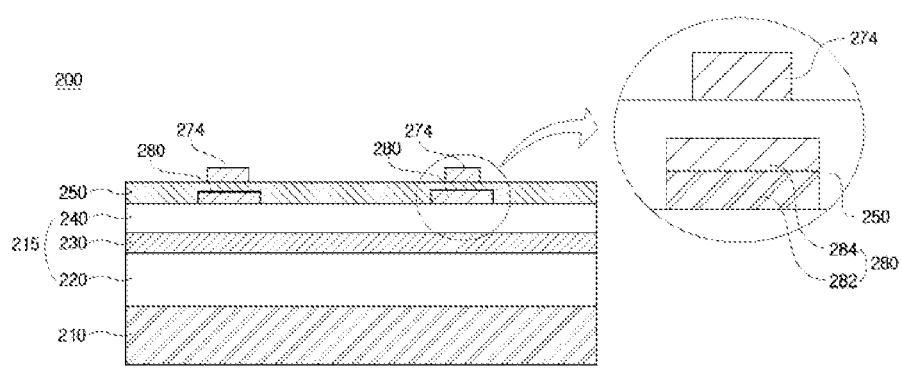
FIG. 18 is a cross-sectional view taken along line B-B' of the light emitting device shown in FIG. 12.

The insertion layer 280 may comprise multiple layers wherein respective layers may have different indexes of refraction. For instance, as illustrated in FIG. 18, the insertion layer 280 may include a first layer 282 and a second layer 284, wherein the first and second layers 282 and 284 may have different indexes of refraction. Since the insertion layer 280 includes multiple layers having different indexes of refraction, light incident on the insertion layer 280 may be reflected at a predetermined angle or refracted and transmitted at a predetermined refractive angle, according to Snell's law.

Figure 19:
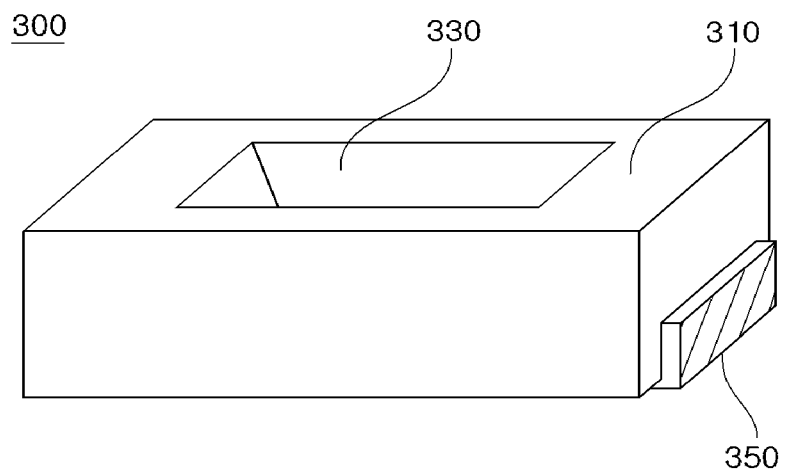
FIG. 19 is a perspective view showing a light-emitting device package including the light emitting device according to one embodiment.
Figure 20:
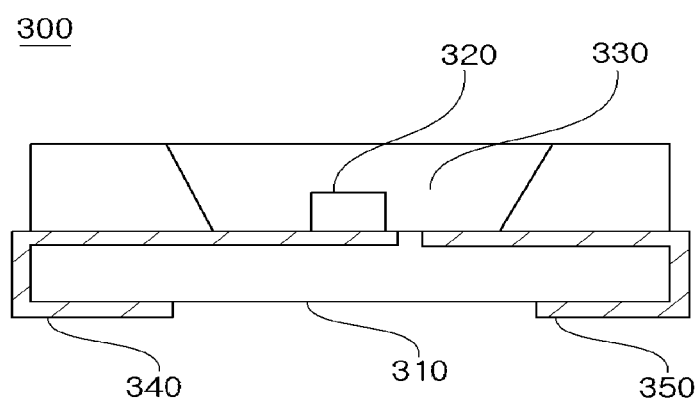
FIG. 20 is a cross-sectional view showing a light-emitting device package including the light emitting device according to one embodiment.

FIG. 19 illustrates a light-emitting device package including a light emitting device according to one embodiment. FIG. 20 is a cross-sectional view showing a light-emitting device package including a light emitting device according to one embodiment.

Referring to FIGS. 19 and 20, the light-emitting device package 300 according to one embodiment comprises: a body 310 having a cavity formed therein; first and second electrodes 340 and 350 mounted on the body 310; a light emitting device 320 electrically connected to the first and second electrodes; and a sealant 330 formed on the cavity, wherein the sealant may include a phosphor (not shown).

The body 310 may be formed using at least one selected from polyphthalamide (PPA) as a resin material, silicon (Si), aluminum (Al), aluminum nitride (AlN), photosensitive glass (PSG), polyaminde 9T (PA9T), syndiotactic polystyrene (SPS), metal materials, sapphire ($Al_2O_3$), beryllium oxide (BeO), a printed circuit board (PCB), or the like. The body 310 may be formed by injection molding, etching, etc., without being particularly limited thereto.

The inner surface of the body 310 may be provided with an inclined surface. The reflective angle of light emitted from the light emitting device 320 may be varied, depending on the angle of the inclined surface. Accordingly, the orientation angle of light discharged to the outside can be controlled.

When viewing the cavity in the body 310 from the top side, it may have various shapes including a circular shape, a rectangular shape, a polygonal shape, an elliptical shape, specifically, and a shape with curved corners, without being particularly limited thereto.

The sealant 330 may fill the cavity and/or include a phosphor (not shown). The sealant 330 may comprise transparent silicon, epoxy or other resin materials and be formed by UV or thermal curing, after filling the cavity.

Types of the phosphor (not shown) may be suitably selected, considering the wavelength of light emitted by the light emitting device 320, to allow the light-emitting device package 300 to produce white light.

The phosphor (not shown) contained in the sealant 330 may be any one selected from a blue light emitting phosphor, blue-green light emitting phosphor, green light emitting phosphor, yellow-green light emitting phosphor, yellow light emitting phosphor, yellow-red light emitting phosphor, orange light emitting phosphor and red light emitting phosphor, depending upon the wavelength of light emitted by the light emitting device 320.

That is, the phosphor (not shown) is excited by first light emitted by the light emitting device 320 to create second light. For instance, in the case where the light emitting device 320 is a blue light emitting diode (LED) and the phosphor (not shown) is a yellow phosphor, the yellow phosphor is excited by blue light to emit yellow light, and blue light emitted from the blue LED and yellow light excited from the blue light are combined, the light-emitting device package 300 may emit white light.

Similarly, if the light emitting device 320 is a green LED, a magenta phosphor as well as blue and red phosphors may be employed together. Alternatively, when the light source 320 is a red LED, a cyan phosphor as well as blue and green phosphors may be employed together.

Such phosphor (not shown) may be any one commonly known in the art, such as a YAG, TAG, sulfide, silicate, aluminate, nitride, carbide, nitride-silicate, borate, fluoride or phosphate based material, etc.

Meanwhile, the body 310 may have the first electrode 340 and the second electrode 350 mounted thereon. The first and second electrodes 340 and 350 may be electrically connected to the light emitting device 320, to supply power to the light emitting device 320.

The first and second electrodes 340 and 350 may be electrically isolated from each other, reflect light emitted by the light emitting device 320 to improve luminous efficacy, and discharge heat generated from the light emitting device 320.

FIG. 19 illustrates the light emitting device 320 as being mounted on the first electrode 350, however, the present disclosure is not particularly limited thereto. The light emitting device 320 as well as the first and second electrodes 340 and 350 may be electrically connected by any one of wire bonding, flip chip, or die bonding.

The first electrode 340 and the second electrode 350 may comprise metal materials, for example, at least one selected from titanium (Ti), copper (Cu), nickel (Ni), gold (Au), chromium (Cr), tantalum (Ta), platinum (Pt), tin (Sn), silver (Ag), phosphorous (P), aluminum (Al), indium (In), palladium (Pd), cobalt (Co), silicon (Si), germanium (Ge), hafnium (Hf), ruthenium (Ru) and iron (Fe), or alloys thereof. In addition, each of the first electrode 340 and the second electrode 350 may be formed in a single or multi-layer structure, without being particularly limited thereto.

The light emitting device 320 is mounted on the first electrode 340 and, for instance, may be a light emitting device to emit red, green, blue or white light or an ultraviolet (UV) light emitting device to emit UV light, without being particularly limited thereto. Moreover, at least one light emitting device 320 may be provided.

The light emitting device 320 may be generally applied to a horizontal type device having all electric terminals formed on the top face thereof, a vertical type device having all electric terminals formed on the top or bottom face thereof, or a flip-chip device.

Meanwhile, the light emitting device 320 may include a reflective layer (not shown) provided under the finger electrode (not shown) and, since it is possible to prevent light emitted by the active layer (not shown) from being absorbed by the finger electrode (not shown), the light emitting device 320 and the light-emitting device package 300 may have improved luminous efficacy.

The light-emitting device package 300 according to one embodiment may be arrayed in plural on a substrate and optical members such as a light guide plate, prism sheet or diffusion sheet may be arranged on a light path of the light-emitting device package.

Such a light-emitting device package 300, substrate and/or optical member may serve as a light unit. A display device, an indicator device and/or a lighting system may be realized by comprising the light emitting device 100 or the light-emitting device package 300 described in the foregoing embodiments, according to another embodiment. For instance, the lighting system may include a lamp, a street lamp, etc.

Figure 21:
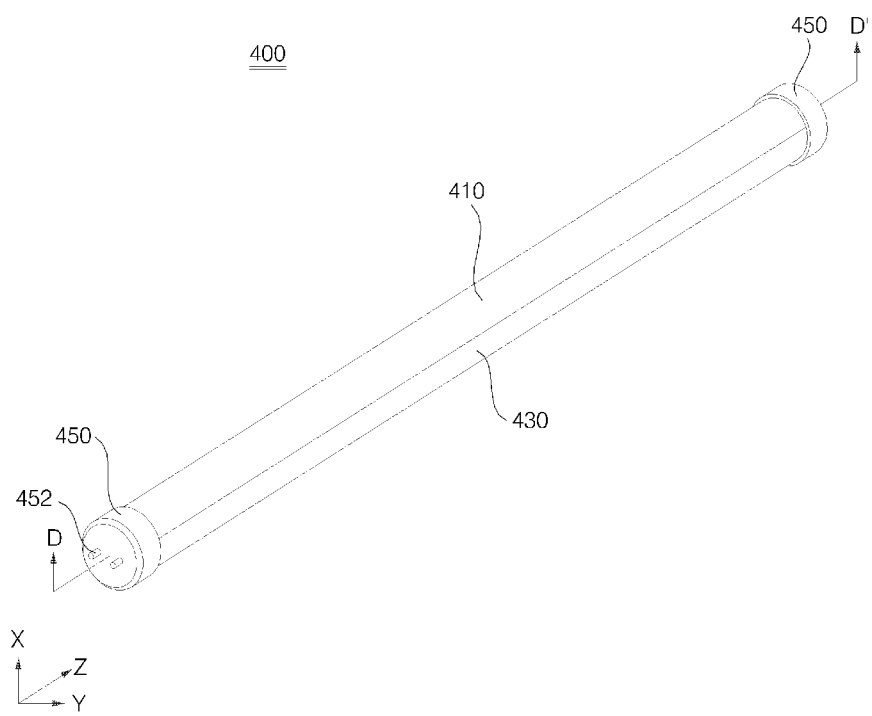
FIG. 21 is a perspective view showing a lighting system including a light emitting device module according to one embodiment.
Figure 22:
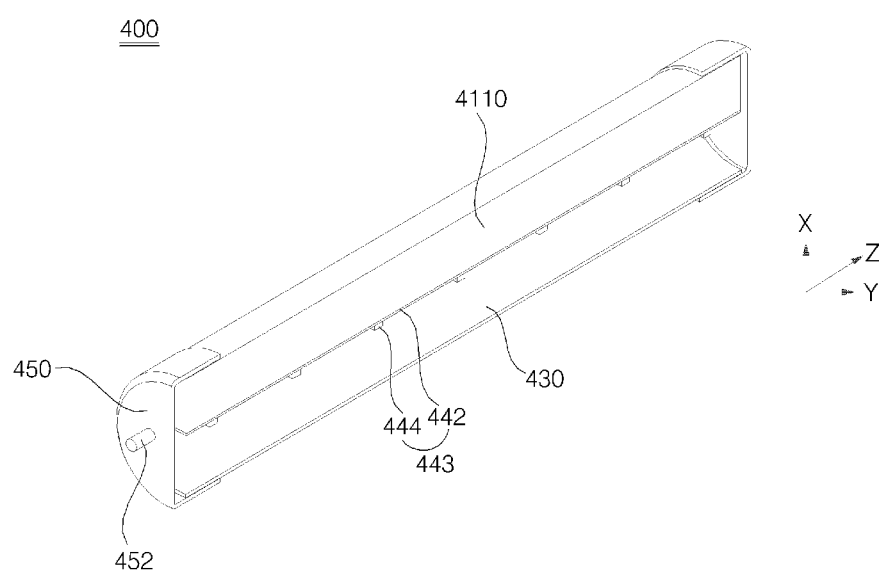
FIG. 22 is a cross-sectional view taken along line D-D' of the lighting system shown in FIG. 21.

FIG. 21 is a perspective view illustrating a lighting system including the light emitting device according to one embodiment, FIG. 22 is a cross-sectional view taken along cross-section D-D' of the lighting system shown in FIG. 21.

That is, FIG. 22 is a cross-sectional view taken along both cross-sections in a length direction Z and a height direction X and when viewed in a horizontal direction Y.

Referring to FIGS. 21 and 22, the lighting system 400 may include a body 410, a cover 430 coupled to the body 410, and finishing caps 450 at both ends of the body 410.

A light-emitting device module 443 may be coupled to the bottom side of the body 410 and, in order to discharge heat generated from a light-emitting device package 444 to the outside through the top of the body 410, the body 410 may be made of metal materials having excellent thermal conductivity and heat dissipation effects, without being particularly limited thereto.

In particular, the light-emitting device package 444 may include a light emitting device (not shown), and the light emitting device (not shown) may include a reflective layer (not shown) below an electrode (not shown) to prevent light emitted by the active layer (not shown) from being absorbed by the electrode (not shown), thereby improving luminous efficacy of the light-emitting device package 444 and the lighting system 400.

The light-emitting device package 444 may be mounted on a substrate 442 with multiple colors and in multiple rows to form an array, and may be spaced from one another by a predetermined interval or, if necessary, by different distances, to control brightness. Such a substrate 442 may be a metal core PCB (MPPCB) or PCB made of FR4.

The cover 430 may take the shape of a circle to surround the bottom of the body 410, without being particularly limited thereto.

The cover 430 protects the light-emitting device module 443 from foreign substances. In addition, the cover 430 prevents glare due to the light-emitting device package 444 and includes diffusion particles to uniformly discharge light to the outside. In addition, a prism pattern or the like may be formed on at least one of the inner and outer faces of the cover 430. Alternatively, a phosphor may be applied to at least one of the inner and outer faces of the cover 430.

Meanwhile, since the cover 430 should exhibit superior light transmittance to discharge light emitted by the light-emitting device package 444 through the cover 430 to the outside, the cover 430 should exhibit sufficient heat resistance to endure heat generated by the light-emitting device package 444. The cover 430 may be composed of a material including polyethylene terephthalate (PET), polycarbonate (PC) or polymethyl methacrylate (PMMA) and the like.

The end cap 450 is arranged on both ends of the body 410 and may be used to seal a power supply (not shown). In addition, the end cap 450 is provided with a power pin 452, allowing the lighting instrument 400 to be applied to a terminal from which a conventional fluorescent light has been removed, without using any additional device.

Figure 23:
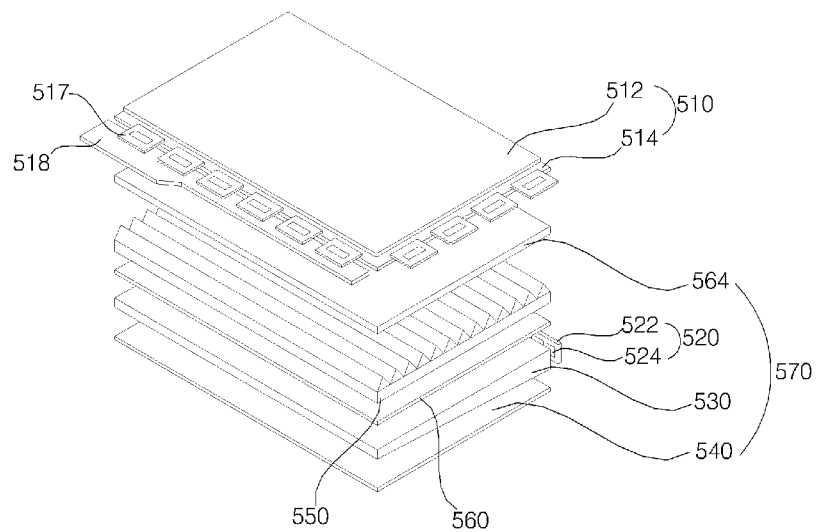
FIG. 23 is an exploded perspective view showing a liquid crystal display including the light emitting device according to one embodiment.

FIG. 23 is an exploded perspective view illustrating a liquid crystal display device employing a light emitting device according to one embodiment.

FIG. 23 illustrates an edge-light type liquid crystal display device 500 which includes a liquid crystal display panel 510 and a backlight unit 570 to supply light to the liquid crystal display panel 510.

The liquid crystal display panel 510 displays an image using light supplied from the backlight unit 570. The liquid crystal display panel 510 includes a color filter substrate 512 and a thin film transistor substrate 514 which face each other through liquid crystal interposed therebetween.

The color filter substrate 512 can render color images to be displayed through the liquid crystal display panel 510.

The thin film transistor substrate 514 is electrically connected to a printed circuit board 518 on which a plurality of circuit components is mounted through a driving film 517. The thin film transistor substrate 514 responds to drive signals supplied from the printed circuit board 518 and may apply drive voltage from the printed circuit board 518 to liquid crystals.

The thin film transistor substrate 514 includes a thin film transistor and a pixel electrode formed as a thin film on other substrates composed of a transparent material such as glass or plastic.

The backlight unit 570 includes: a light-emitting device module 520 to emit light, a light guide plate 530 to convert light emitted by the light-emitting device module 520 into surface light and supply the light to the liquid crystal display panel 510, a plurality of films 550 and 560 to uniformize brightness distribution of light emitted by the light guide plate 530 and improve vertical incidence, and a reflective sheet 540 to reflect light emitted to the back of the light guide plate 530 to the light guide plate 530.

The light-emitting device module 520 includes a plurality of light-emitting device packages 524 and a PCB 522 on which the light-emitting device packages 524 are mounted to form an array.

Specifically, since the light-emitting device package 524 includes the light emitting device (not shown), the light emitting device (not shown) includes the reflective layer (not shown) provided below the electrode (not shown), and it is possible to prevent light emitted by an active layer (not shown) from being absorbed by the electrode (not shown), the backlight unit 570 as well as the light-emitting device package 524 may achieve improvement of luminous efficacy.

Meanwhile, a backlight unit 570 includes a diffusion film 560 to diffuse light projected from the light guide plate 530 toward the liquid crystal display panel 510, a prism film 550 to concentrate the diffused light and thus improve vertical incidence, and a protective film 564 to protect the prism film 550.

Figure 24:
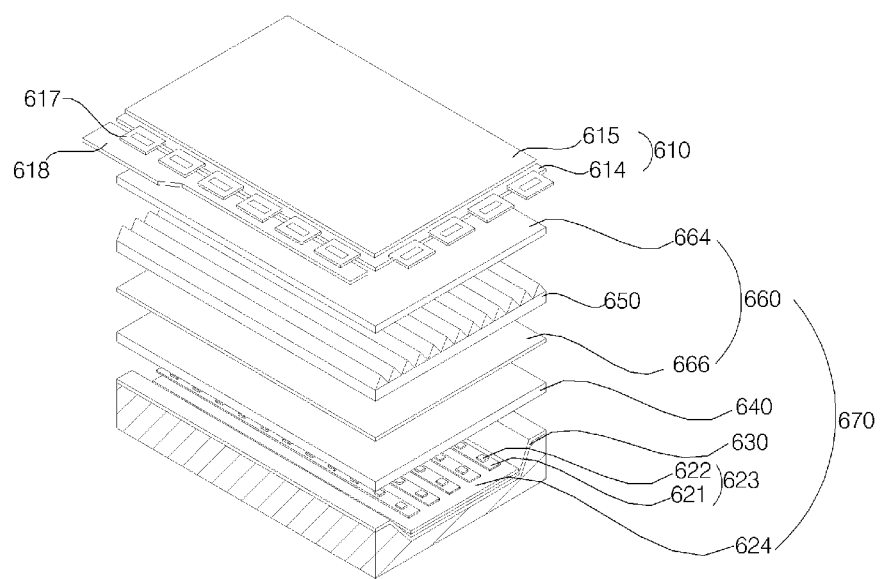
FIG. 24 is an exploded perspective view showing a liquid crystal display including the light emitting device according to one embodiment.

FIG. 24 is an exploded perspective view illustrating a liquid crystal display including the light emitting device according to one embodiment. However, the contents illustrated and described in FIG. 23 are not mentioned in detail.

FIG. 24 illustrates a direct-type liquid crystal display device 600 which includes a liquid crystal display panel 610 and a backlight unit 670 to supply light to the liquid crystal display panel 610.

The liquid crystal display panel 610 is substantially the same as described in FIG. 23 and a detailed explanation thereof is omitted.

The backlight unit 670 includes a plurality of light-emitting device modules 623, a reflective sheet 624, a lower chassis 630 in which the light-emitting device modules 623 and the reflective sheet 624 are accepted, a diffusion plate 640 positioned above the light-emitting device modules 623, and a plurality of optical films 660.

Each light-emitting device module 623 includes a plurality of light-emitting device packages 622 and a PCB 621 on which the light-emitting device packages 622 are mounted to form an array.

Specifically, since the light-emitting device package 622 includes the light emitting device (not shown), the light emitting device (not shown) includes the reflective layer (not shown) provided below the electrode (not shown), and it is possible to prevent light emitted by an active layer (not shown) from being absorbed by the electrode (not shown), the backlight unit 670 as well as the light-emitting device package 622 may achieve improvement of luminous efficacy.

The reflective sheet 624 reflects light emitted from the light-emitting device package 622 toward the liquid crystal display panel 610, so as to improve luminous efficacy.

Meanwhile, light emitted from the light-emitting device module 623 is projected onto the diffusion plate 640 and an optical film 660 is arranged on top of the diffusion plate 640. The optical film 660 includes a diffusion film 666, a prism film 650 and a protective film 664.

As is apparent from the foregoing, the light emitting device according to embodiments of the present disclosure includes a reflective layer under an electrode, to prevent light emitted by an active layer from being absorbed by the electrode, thereby enhancing luminous efficacy.

The light emitting device according to embodiments of the present disclosure is not limited to configurations and processes illustrated in the afore-mentioned embodiments. Further, those skilled in the art will appreciate that a variety of combinations and modifications of partially or entirely selected parts of respective embodiments are possible.

Although the embodiments of the present disclosure have been disclosed for illustrative purposes, those skilled in the art will appreciate that various modifications, additions and substitutions are possible, without departing from the scope and spirit of the disclosure as disclosed in the accompanying claims. For example, the respective elements described in detail in the embodiments may be modified. Further, it will be understood that differences relating to these modifications, additions and substitutions are within the scope of the disclosure defined in the accompanying claims.

What is claimed is:

1. A light emitting device, comprising:
a substrate;
a light emitting structure provided on the substrate, which includes a first conductive semiconductor layer, a second conductive semiconductor layer and an active layer placed between the first and second conductive semiconductor layers;
a transmissive electrode layer arranged on the light emitting structure;
an electrode including a pad electrode and a finger electrode that is connected to the pad electrode and extends in at least one direction, provided on the light emitting structure; and
an insertion element provided between the electrode and the second conductive semiconductor layer,
wherein the insertion element is formed such that at least one region of the insertion element overlaps with the finger electrode in a vertical direction.

2. The light emitting device according to claim 1, wherein the insertion element is configured to change a route of light emitted by the active layer.

3. The light emitting device according to claim 2, wherein the insertion element is configured to reflect light emitted by the active layer.

4. The light emitting device according to claim 2, wherein the insertion element is configured to refract light emitted by the active layer.

5. The light emitting device according to claim 2, wherein the insertion element includes at least one selected from Ag, Ni, Al, Rh, Pd, Ir, Ru, Mg, Zn, Pt, Au, Hf, Cu, IZO, IZTO, IAZO, IGZO, IGTO, AZO, ATO, IZO/Ni, AZO/Ag, IZO/Ag/Ni and AZO/Ag/Ni.

6. The light emitting device according to claim 2, wherein the transmissive electrode layer includes at least one selected from ITO, IZO(In—ZnO), GZO(Ga—ZnO), AZO(Al—ZnO), AGZO(Al—Ga ZnO), IGZO(In—Ga ZnO), $IrO_x$, $RuO_x$, $RuO_x$/ITO, Ni/$IrO_x$/Au and Ni/$IrO_x$/Au/ITO.

7. The light emitting device according to claim 2, wherein the insertion element contacts the second conductive semiconductor layer.

8. The light emitting device according to claim 2, wherein the insertion element is spaced apart from the second conductive semiconductor layer.

9. The light emitting device according to claim 2, wherein the insertion element has curvature on at least one region thereof.

10. The light emitting device according to claim 2, wherein a width of the insertion element ranges from 2 μm to 2.5 mm.

11. The light emitting device according to claim 2, wherein a thickness of the insertion element ranges from 2000 Å to 5 μm.

12. The light emitting device according to claim 2, wherein the insertion element includes an extension part and the extension part has at least one region overlapping with the pad electrode in a vertical direction.

13. The light emitting device according to claim 12, wherein an area of the extension part is larger than an area of the pad electrode.

14. The light emitting device according to claim 2, further comprising a transmissive insulation layer provided between the finger electrode and the insertion element.

15. The light emitting device according to claim 14, wherein the transmissive insulation layer contains $SiO_2$ or $Al_2O_3$.

16. The light emitting device according to claim 15, wherein the insertion element is formed such that at least one region thereof contacts the transmissive insulation layer.

17. The light emitting device according to claim 15, wherein the insertion element includes unevenness and the unevenness is formed in a region to contact the transmissive insulation layer.

18. The light emitting device according to claim 2, wherein the insertion element contains a material having a light reflectivity of 30% or more.

19. The light emitting device according to claim 2, wherein the insertion element has a region extending in a lateral direction of the electrode.

20. The light emitting device according to claim 2, wherein the insertion element includes first and second layers having different reflectivity.

* * * * *